Nov. 29, 1966 A. J. GRUODIS 3,289,009

SWITCHING CIRCUITS EMPLOYING SURFACE POTENTIAL CONTROLLED SEMICONDUCTOR DEVICES

Filed May 7, 1963

INVENTOR
ALGIRDAS J. GRUODIS

BY Joseph C. Redmond, Jr.

ATTORNEY

United States Patent Office 3,289,009

Patented Nov. 29, 1966

3,289,009

SWITCHING CIRCUITS EMPLOYING SURFACE POTENTIAL CONTROLLED SEMICONDUCTOR DEVICES

Algirdas J. Grudis, Poughkeepsie, N.Y., assignor to International Business Machines Corporation, New York, N.Y., a corporation of New York Filed May 7, 1963, Ser. No. 278,653
4 Claims. (Cl. 307—88.5)

This invention relates to switching circuits and, more particularly, to switching circuits employing surface potential controlled semiconductor devices.

A recent semiconductor device, designated surface potential controlled device (SCT), combines normal device operation with electric field effects. The device is described in an article entitled, "A New Semiconductor Tetrode, the Surface Potential Controlled Transistor," by C. T. Sah, which appeared in the "Proceedings of the Institute of Radio Engineers," pages 1623–1634, dated November 1961. The device has a plurality of signal input electrodes. Plural input electrode devices provide advantages over single input electrode devices, i.e., conventional devices in that a reduced number of active elements is required for the same logic. Plural input electrode devices, however, are more expensive in cost than single input electrode devices. To be competitive with single input electrode devices, plural input electrode devices must be arranged to have logic versatility and improved circuit performance to justify their additional cost. It is desirable, thereof, to provide circuit operation and configurations of SCT devices which will exploit all of the advantages of the devices in information handling systems.

A general object of the invention is improved circuit operation and configurations for SCT devices.

One object is an SCT emitter follower that provides signal inversion.

Another object is an SCT emitter follower that provides signal inversion and voltage gain.

Still another object is an SCT device arranged for Exclusive-OR operation.

These and other objects are accomplished in accordance with the present invention, one illustrative embodiment of which comprises an SCT device having collector, base, gate and emitter electrodes. Signal inversion and voltage gain across the gate-emitter electrodes are accomplished by (1) a base current supply including an impedance and appropriate voltage supply connected to the base electrode, and (2) an input circuit connected to the gate electrode. The collector is coupled to a voltage supply. The emitter electrode is connected to a source of reference potential through a preselected resistor. An output circuit is connected between the load resistor and emitter electrode. The base current supply comprising the impedance and voltage provides a limited amount of current to the load resistor to produce an output voltage $V_{1o} \approx 0$ (approaching the reference potential) which is below $V_{1i}$ the initial gate signal voltage level. $V_{1i}$ establishes electric field effects which maintains the device in a nonconducting condition. When the gate signal starts to change to a level $V_{2i}$ considerably less than $V_{1i}$, the electric field effects are reduced and because of the relatively large amount of base current, the device starts to switch to a conducting condition. The output voltage commences to rise which reduces the base current supplied by the base circuit current supply. However, the gate to emitter potential also changes, so that the base current becomes more effective. The base current selected permits the device to turn on before $V_{2i}$ is reached. The output voltage ($V_{2o}$) approaches the collector voltage as the device saturates. The final output voltage $V_{2o}$ exceeds the input voltage $V_{2i}$ and is larger than $V_{1i}$ the initial gate signal voltage level. When the gate voltage starts to return to $V_{1i}$ (the initial input level from $V_{2i}$ (the final input level), the potential across the gate-emitter electrodes is increased and the device commences to turn off. The reduced base current flow selected permits the device to turn off at an input voltage level less than $V_{2o}$, the output voltage which is approximately at the collector potential. Since the final input and output voltage levels are substantially interchanged for each conducting condition of the device, the circuit provides signal inversion. Since the input voltage level is less than the output final voltage level when turn-on or turn-off of the device occurs, the circuit provides voltage gain. Modifying the base circuit arrangement and taking the output at the collector in lieu of the emitter, adapts the over-all circuit for Exclusive-OR operation. The modified base circuit includes a diode suitably connected between the gate and base electrodes and a Kirchoff Adder including bias means connected to both base and gate electrodes. Normally, first like voltage levels at the adder bypass the base current through the diode to the bias means instead of supplying the current to the device. The absence of base current establishes operation of the device in a nonconducting condition. When a second signal level is established at one or the other terminals of the Kirchoff Adder, the diode is rendered nonconducting and the normal base current is directed to the device, which conducts. An output taken at the collector provides an indication of this operation. When both inputs to the Kirchoff Adder are at a second level, the diode is rendered nonconducting, but the gate voltage is established at a level to prevent the device from conducting even though current is supplied to the base electrode. Thus, the device provides Exclusive-OR operation since like signals establish the device in one conducting condition and unlike signals establish the device in an opposite conducting condition.

One feature of the invention is circuit means cooperating with the base electrode of an SCT device to provide voltage gain and signal inversion across the gate-emitter electrodes of the device.

Another feature of the invention is a second circuit means cooperating with the base and gate electrode of an SCT device to provide Exclusive-OR operation of the device in response to a pair of input signals.

A specific feature is an impedance and voltage supply of preselected magnitudes connected to the base electrode of an SCT device, the impedance and voltage supply developing a base current low enough when the device is on so that the device will turn off without the input voltage exceeding the output voltage and further arranged so that the input signal does not have to swing lower than the output voltage to turn on the device.

Another specific feature is an impedance, a diode, a Kirchoff Adder and a voltage supply suitably connected between the base and gate electrodes of an SCT device, whereby unlike inputs to the Kirchoff Adder operate the diode to direct current to the device base electrode to render the device conducting, and like inputs operate the diode and gate electrode to render the device non-conducting.

The foregoing and other objects, features and advantages of the invention will be apparent from the following more particular description of preferred embodiments of the invention as illustrated in the accompanying drawings.

Figure 1:
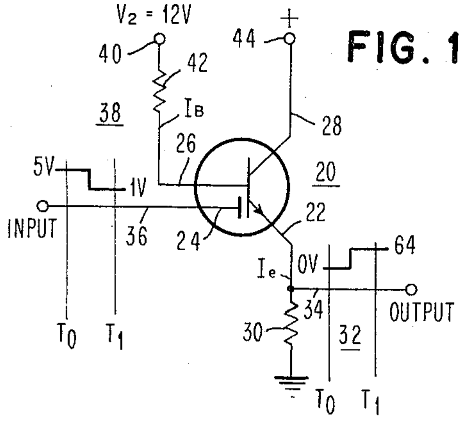
FIGURE 1 is an electrical schematic of one embodiment of the present invention.

Referring to FIGURE 1, a surface potential controlled device 20 is arranged in an emitter-follower circuit configuration. A surface potential controlled device is described in the article by C. T. Sah, supra. The device is also described in U.S. Patent 3,204,160 to C. T. Sah issued August 31, 1965, and filed April 12, 1961. The device 20 includes an emitter electrode 22, gate electrode 24, base electrode 26 and collector electrode 28. The emitter electrode is connected through a resistor 30 to a source of reference potential 32, typically ground. An output circuit 34 is connected between the resistor 30 and emitter electrode 22. An input circuit 36 is connected to the gate electrode 24. A current supply 38 which provides a limited amount of base current includes a source of voltage 40 and a resistor 42. The supply 38 is connected to the base electrode 26. The collector electrode is connected to a voltage supply 44. The polarity of the supply is selected to produce the current flow through the device 20 in accordance with well-known device operation. Normally, an emitter follower circuit provides an output signal that follows an input signal which is at one of two possible voltage levels. The output signal level is below the input voltage level due to the voltage degradation or drop across the base-emitter junction. The present circuit, however, provides an output signal level that is at the other of two input signal levels or the inverse of the input signal level and is amplified with respect to the corresponding input signal level. These notable improvements in emitter-follower circuit operation, i.e., inversion and voltage gain will be described in conjunction with the operating characteristics of the SCT device.

Figure 2:
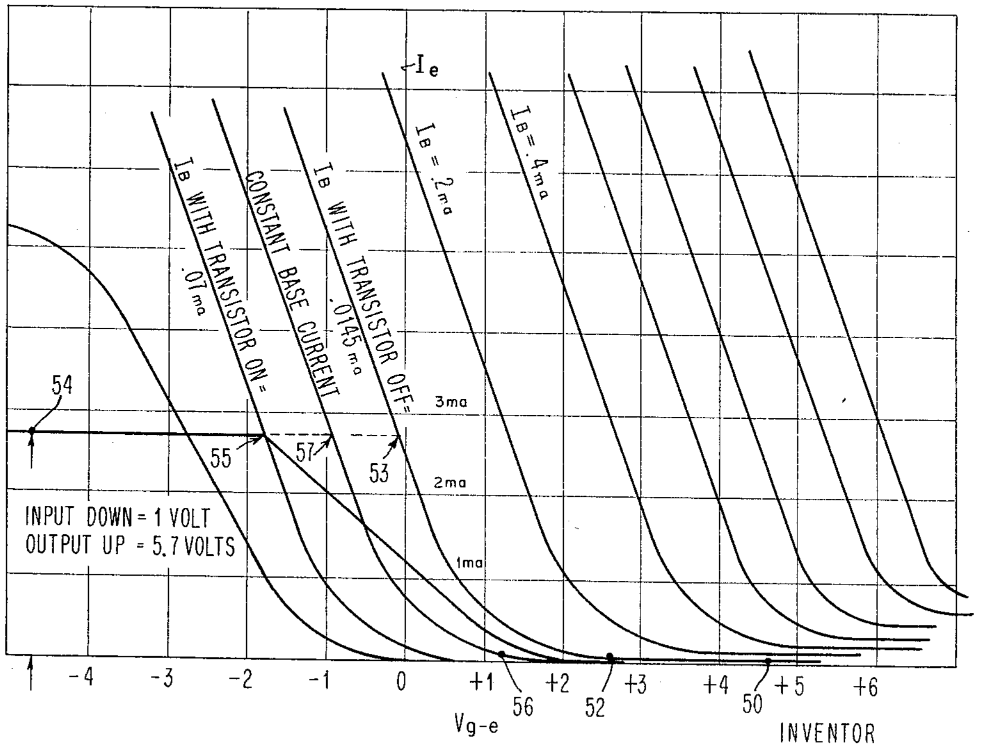
FIGURE 2 is a voltage-current characteristic for an SCT device, the voltage being that which is applied between the gate and emitter electrodes of the device and the current being that which appears at the emitter for various values of base current.

Referring to FIGURES 1 and 2, the inverting operation of the circuit will be described. Current flow is taken at the emitter electrode and is represented by the ordinate of the graph. The abscissa of the graph represents the voltage differential between the gate and emitter electrodes. Positive values of gate-emitter voltages represent the condition where the voltage at terminal 36 exceeds that at terminal 34. Negative gate-emitter voltages represent the condition where the voltage at terminal 36 exceeds that at terminal 34. The emitter current drops to a value equal to the base current as the gate-emitter voltage increases and the base current remains constant. With a suitable gate voltage at terminal 36, the device does not conduct. The output voltage at terminal 34, as a result, approaches the reference potential, which is lower than the voltage appearing at terminal 36. Conversely, as the gate-emitter voltage becomes negative, the emitter current increases for a particular base current. The output voltage, therefore, approaches that of the collector which is larger than the voltage appearing at terminal 36. Thus, FIGURE 2 indicates the inverting operation of the circuit of FIGURE 1, that is, as between two possible voltage levels, the output and input voltages are the inverse of each other.

Besides providing inverting operation, the circuit of FIGURE 1 is also arranged to provide voltage gain. The proper selection of the supply 40, resistor 42 and resistor 30 enables the input level to start turning off the device without exceeding the output voltage. Similarly, the input voltage does not need to fall below the output voltage in order to start turning on the device. Since in neither case of turn-on or turn-off of the device does the input exceed the output, the circuit provides voltage gain. The voltage gain is obtained through providing a pre-selected amount of base current in the device for each input signal condition. The magnitude of the base current is variable in accordance with the conducting condition of the device. Using a variable amount of base current, the present circuit provides greater voltage gain than where a constant base current supply is connected to the base electrode. The reason for this latter advantage will be explained in more detail hereinafter.

It has been determined that in the vicinity of the ordinate axis of FIGURE 2 a range of base currents exists which permit the circuit of FIGURE 1 to operate with signal inversion and voltage gain. The base current is calculated as follows:

$$Ib=\frac{V_s-V_d}{R_{42}+R_{30}} \qquad (1)$$

where $V_s$=the base supply voltage 40
$V_d$=the drop across the base-emitter junction of device 20 (assumed to be 0.6 v.)
$R_{42}$=the base supply resistor
$R_{30}$=the load resistor A base current of 0.145 ma. has been found to be within the range which permits the circuit to operate with signal inversion and voltage gain. Assuming a voltage supply ($V_s$) of 12 volts, a load resistor ($R_{30}$) of 2K the base resistor ($R_{42}$) is obtained by rearranging and substituting into equation. Solving Equation 1 for $R_{42}$, it turns out that a base resistor of 75K will permit the required current to flow to produce signal inversion and voltage gain.

The inversion and voltage gain features of the present invention will now be described in conjunction with FIGURES 1 and 2. For purposes of the description, it is necessary to assume a collector supply voltage 44 of +6 volts; base supply voltage 42 at +12 volts; certain input and output signal swings as well as the type of SCT device that is suitable for operation. Laboratory experience indicates that 5 volt and 1 volt input signals demonstrate the invention when a Fairchild Camera Instrument Corporation, Mountain View, California, laboratory model SCT device is employed. A 5 volt input signal establishes a voltage between the gate and emitter electrodes ($V_{g-e}$) of 4.71 volts. The emitter voltage is 0.29 due to emitter current drop across the load resistor. Thus, at time $T_0$, operation of the SCT device is indicated as point 50 on FIGURE 2. When the input voltage is changed from 5 volts toward 1 volt, the device commences to conduct at 2.6 volts, indicated as operating point 52. The voltage difference between gate and emitter electrodes is further reduced as the device conducts. The device commences to conduct heavier and shortly reaches saturation which is approximately three milliamps. The output voltage, therefore, approaches the 6 volt collector voltage which drives the gate-emitter voltage into the negative region of FIGURE 2. When the input voltage equals the output voltage, indicated as operating point 53, the base current decreases to .07 milliamps which is approximately half of the base current previously flowing for reasons to be explained hereinafter. The input voltage continues to fall until 1 volt is reached. Simultaneously, the output voltage reaches 5.7 volts, the collector voltage 6.0 minus the saturation drop (0.3 volts). The gate-emitter voltage, therefore, becomes −4.7 volts [5.7 v.($V_{34}$)−1 v.($V_{24}$)]. The base current under these conditions is 0.07 ma. since the emitter voltage is 5.7 volts. Operation of the device is established at point 54, indicated on FIGURE 2. Thus, at time $T_1$ a 1 volt input signal provides a 5.7 volt output. During the switching from nonconduction to conduction, the prior output voltage, i.e., 0.29, was not reached.

When the input voltage is increased toward 5 volts to return the device to point 50, the gate-emitter voltage decreases negatively. Simultaneously, the emitter or output current decreases along the .07 current line. The device starts to turn off when the gate-emitter voltage reaches −1.7 volts (indicated as point 55 on FIGURE 2), this is an input of 3 volts since the output is at 5.7 volts, which is greater than the starting input voltage level.

When the device turns off, the output voltage approaches 0.3 volt, as previously indicated, and the gate-emitter voltage increases to 4.7 or operating point 50. Thus, a 5 volt input signal has turned off a 5.7 volt output signal and the conducting condition of the device was changed before the starting input signal level was reached. The device returns to the operating condition indicated for time $T_0$.

Summarizing, the circuit exhibits power gain in that during turn-on and turn-off of the device the input voltage never exceeds the output voltage. This feature is due to the base current being selected such that the maximum current provided is just enough to keep the device in saturation when the gate signal is down and the minimum current provided is just enough to keep the device nonconducting when the gate signal is up. Thus, the circuit permits a smaller signal than the output signal to change the conducting condition of the device. Such operation is normally referred to as voltage gain. Since the input and output voltages are at different levels, the circuit is defined as an emitter follower that provides inverting operation with power gain.

Not all base currents provide voltage gain with 5 and 1 volt turn-off and turn-on signals, respectively. As an example, a base current of 0.4 milliamps requires an input signal that exceeds the output signal to keep the device in a nonconducting condition. In the nonconducting condition of the device, the output signal is of the order of 0.8 volts, but to keep the device nonconducting requires 5.5 volts ($V_{g-e}$), thus, the input must be 6.3 volts. When the device is switched to conducting, the base current falls to approximately 0.2 ma. after device saturation. The output rises to 5.7 volts which is less than the input required to keep the device in the nonconducting condition. Thus, modified circuit would not provide voltage gain. The base current selected, therefore, should be in the vicinity of the zero volt gate-to-emitter voltage in order to obtain voltage gain.

Although the circuit has shown a variable base current flowing for conducting and nonconducting condition of the device, the circuit may also be arranged to provide a constant base current. The impedance $R_{42}$, for the input and output signal conditions and SCT devices previously described, is of the order of 75K ohms. A constant base current, however, does not provide as large a voltage gain as the variable current. This can best be seen by examining the characteristics of FIGURE 2. Note, that to turn the device on (point 56) requires a $V_{g-e}$ of 1.1 volts which is 1.5 volts lower than operating point 52, and to turn the device off requires a $V_{g-e}$ of $-0.9$ (point 57) which is 0.8 volts higher than operating point 55.

Figure 3:
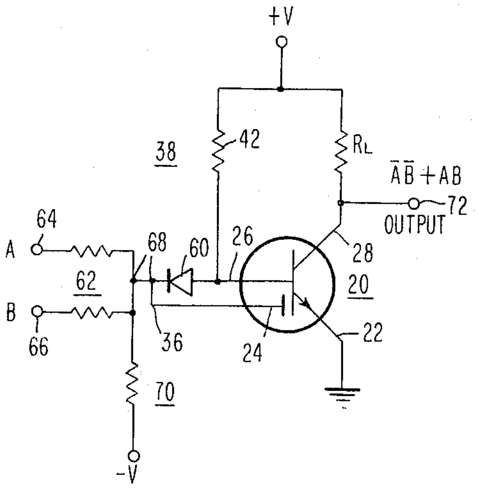
FIGURE 3 is an electrical schematic of another embodiment of the present invention.

A second embodiment of the present invention is adapted to perform an Exclusive-OR operation. Turning now to FIGURE 3, like elements to those shown in FIGURE 1 have corresponding reference characters. The Exclusive-OR circuit includes a diode 60 connected between the electrodes 26 and 36. A Kirchoff Adder 62 including a first input terminal 64 and a second terminal 66 is connected to a common node 68 between the gate electrode and the diode. A biasing supply 70 is connected to the Kirchoff Adder. Completing the circuit is an output circuit 72 connected to the collector electrode 28. The load resistor 30 and output circuit 34, shown in FIGURE 1, are omitted, since the device is arranged in a common emitter configuration instead of an emitter follower configuration.

Normally, the current supply 38 provides current through the diode 60 to bias supply 70. Little or no current is provided by the current supply to the base electrode. The gate voltage is also down so that the device, although able to conduct, does not conduct due to the absence of the base current. Unlike inputs reverse bias the diode so that the base current is directed into the device. The magnitude of the input is selected so that the gate electrode is not biased to the point where the device is rendered nonconducting. Accordingly, current flows in the device and the output falls toward ground. With both inputs up, the diode is again rendered nonconducting, but the magnitude of the voltage applied at the input terminals is sufficient to operate the gate electrode to render the device nonconducting.

Summarizing, therefore, like inputs to the Kirchoff Adder render the device nonconducting whereas unlike inputs render the device conducting. This operation corresponds to the well-known Exclusive-OR function.

The present invention, therefore, has provided improved operation of surface potential controlled devices. The circuit enables the base-emitter junction to be employed in performing inversion required for information handling systems. Further, the modification of the circuit to provide Exclusive-OR operation permits such a logic function to be performed in computer systems at relatively low cost due to the use of a sole device. These features, plus the simplicity and versatility of the present circuit arrangement enables the full potential of the SCT device to be employed in information handling systems.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A switching circuit comprising
   a surface potential controlled semiconductor device having collector, base, gate and emitter electrodes,
   biasing means rendering the device operative connected between the collector and emitter electrodes,
   current means connected to the base electrode,
   signal input means responsive to a plurality of signals connected to the gate electrode,
   non-linear impedance means interconnecting the gate and base electrodes, and
   output circuit means connected to the collector electrode.

2. A switching circuit comprising
   a surface potential controlled semiconductor device having collector, base, gate and emitter electrodes,
   biasing means rendering the device operative connected between the collector and emitter electrodes,
   current means connected to the gate electrode,
   a Kirchoff Adder connected to the gate electrode,
   a non-linear impedance connected between the gate and base electrodes,
   an output circuit means connected to the collector electrode,
   the presence of like signals at the Kirchoff Adder rendering the device nonconducting and the presence of unlike signals at the Kirchoff Adder rendering the device conducting.

3. A switching circuit comprising
   a surface potential controlled semiconductor device having collector, base, gate and emitter electrodes,
   said semiconductor device having a base-emitter voltage drop ($V_d$) and being connected in a common collector circuit configuration whereby a load resistor ($R_1$) is connected to the emitter electrode,
   the gate electrode adapted to receive an input signal, and output circuit connected across the load resistor, and
   a base supply including a voltage supply ($V_s$) and a base resistor ($R_b$) connected to the base electrode,
   the base supply providing a base current ($I_b$) in the vicinity of a zero volt gate-to-emitter voltage, the base current being defined by $$I_b=\frac{V_s-V_d}{R_1+R_b}$$

whereby a maximum base current is provided to keep the device in a saturating condition when the input signal is at a first level and a minimum base current is provided to keep the device in a non-conducting condition when the input signal is at a second level.

4. The switching circuit defined in claim 3 wherein the first and second input signal levels substantially appear at the output circuit in inverse order.

References Cited by the Examiner

UNITED STATES PATENTS

| | | | |
|---|---|---|---|
| 2,765,115 | 10/1956 | Beloungie | 307—88.5 |
| 2,901,605 | 8/1959 | Younker | 328—159 |
| 3,204,160 | 8/1965 | Sah | 307—88.5 X |

ARTHUR GAUSS, *Primary Examiner.*

B. P. DAVIS, *Assistant Examiner.*